United States Patent
Hugo et al.

[11] Patent Number: 5,826,322
[45] Date of Patent: Oct. 27, 1998

[54] PROCESS AND APPARATUS FOR THE PRODUCTION OF PARTICLES FROM CASTINGS WHICH HAVE SOLIDIFIED IN AN ORIENTED MANNER

[75] Inventors: Franz Hugo, Aschaffenburg; Hans-Johann Kemmer, Rödermark; Bernd Sitzmann, Maintal; Michael Protzmann, Wächtersbach, all of Germany

[73] Assignee: ALD Vacuum Technologies GmbH, Erlensee, Germany

[21] Appl. No.: 681,014

[22] Filed: Jul. 22, 1996

[30] Foreign Application Priority Data

Aug. 2, 1995 [DE] Germany ............... 195 28 291.4

[51] Int. Cl.⁶ ............... B22D 11/126; B22D 13/04; B22D 9/04; B22E 9/04
[52] U.S. Cl. ............... 29/527.5; 29/527.6; 164/114; 164/301; 264/8
[58] Field of Search ............... 164/114, 301, 164/46, 429, 479; 29/527.5, 527.6; 425/8, 6; 264/8

[56] References Cited

U.S. PATENT DOCUMENTS

| | | | |
|---|---|---|---|
| 2,245,421 | 6/1941 | Von Frankenberg Und Ludwigsdorf et al. | 29/527.5 |
| 2,383,310 | 8/1945 | Hazelett | 164/479 X |
| 2,623,809 | 12/1952 | Myers | 164/114 X |
| 3,584,105 | 6/1971 | Pekor | 164/114 X |
| 3,816,189 | 6/1974 | Haberer et al. | 148/101 |
| 4,194,554 | 3/1980 | Pierrel | 164/301 |
| 4,301,854 | 11/1981 | Bedell et al. | 164/479 |
| 4,434,836 | 3/1984 | Niiyama et al. | 164/479 X |
| 4,448,610 | 5/1984 | Bellocci | 164/114 X |
| 4,495,691 | 1/1985 | Masumoto et al. | 29/527.5 |
| 4,515,864 | 5/1985 | Singer | 428/546 |
| 4,658,404 | 4/1987 | Sick et al. | 373/143 |
| 4,783,900 | 11/1988 | Hathaway et al. | 29/527.6 |

FOREIGN PATENT DOCUMENTS

| | | | |
|---|---|---|---|
| 2528843 | 1/1976 | Germany . | |
| 57041846 | 3/1982 | Japan | B22D 5/00 |
| 1171217 | 7/1989 | Japan . | |
| 4358008 | 12/1992 | Japan | B22F 9/04 |

*Primary Examiner*—Horace M. Culver
*Attorney, Agent, or Firm*—Fulbright & Jaworski, LLP

[57] ABSTRACT

For the production of particles from castings (10) of metals from the group of the lanthanides, aluminum, boron, chromium, iron, calcium, magnesium, manganese, nickel, niobium, cobalt, titanium, vanadium, zirconium, and their alloys, which have solidified in an oriented manner, especially for the production of materials from the group of magnetic materials, hydrogen storage elements (hydride storage elements), and battery electrodes, a melt of the metal is applied in a nonreactive atmosphere to the inside of an at least essentially cylindrical cooling surface (9) according to the principle of centrifugal casting. The cylinder rotates at high speed around a rotational axis, and the melt is cooled proceeding from the outside toward the inside with an essentially radial direction of solidification. The hollow casting (10) is then reduced to particles. The melt is preferably applied to the rotating cooling surface (9) in a thickness which is no more than 10%, and preferably no more than 5%, of the diameter of the cooling surface (9), and the diameter of the cooling surface (9) is at least 200 mm, and preferably at least 500 mm.

25 Claims, 4 Drawing Sheets

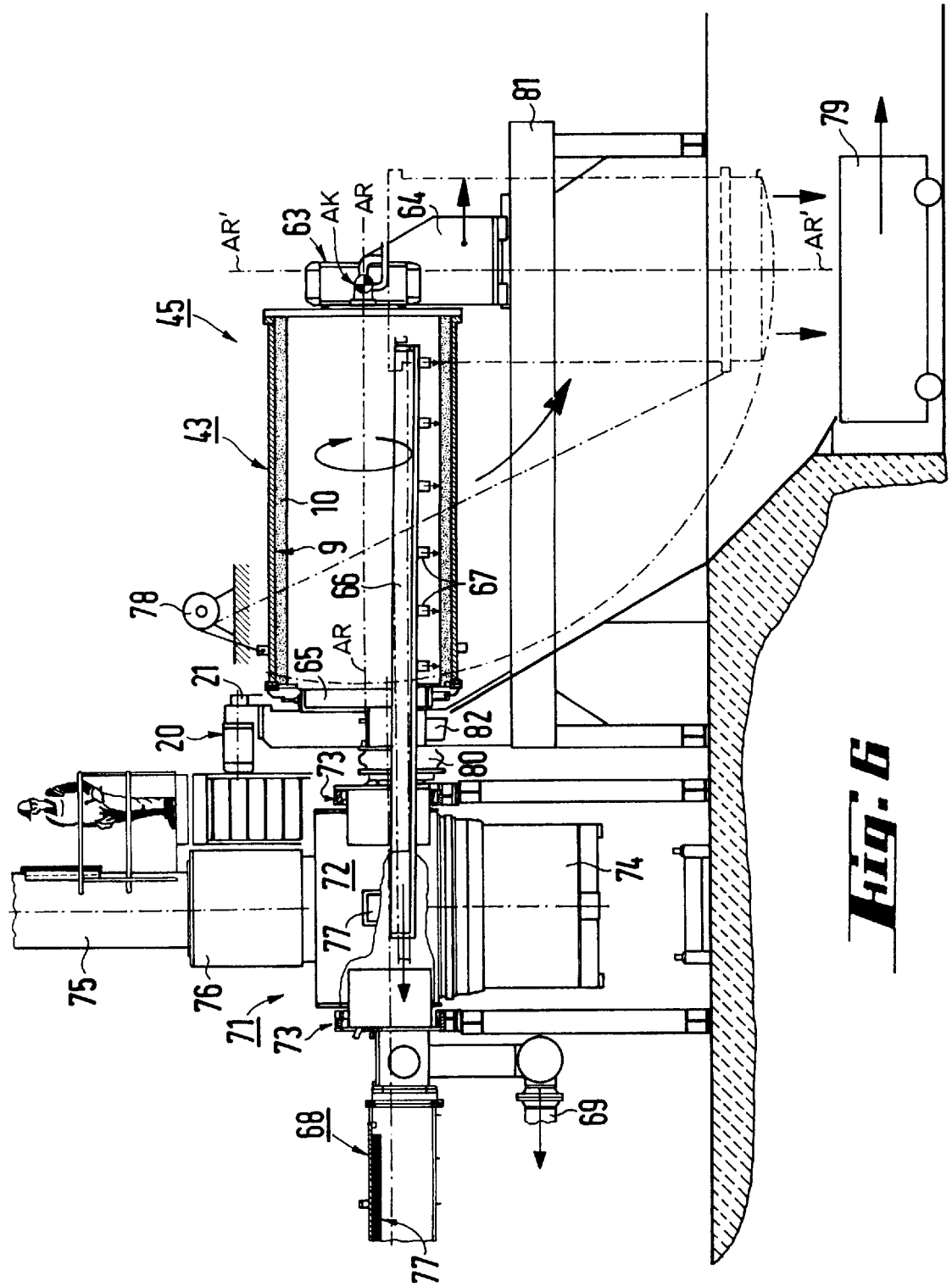

PROCESS AND APPARATUS FOR THE PRODUCTION OF PARTICLES FROM CASTINGS WHICH HAVE SOLIDIFIED IN AN ORIENTED MANNER

BACKGROUND OF THE INVENTION

The invention pertains to a process for the production of particles from castings of the metals of the group of the lanthanides, aluminum, boron, chromium, iron, calcium, magnesium, manganese, nickel, niobium, cobalt, titanium, vanadium, zirconium, and their alloys, which have solidified in an oriented manner, especially for the production of materials of the group of magnetic materials, hydrogen storage elements (hydride storage elements), and battery electrodes, by casting a melt of the metals in a nonreactive atmosphere onto a cooling surface and by reducing the resulting castings to particles.

Large amounts of particles of certain alloys, several actual examples of which are given in the following, are required for new technologies. They can be recovered in the form of metal dust, fine granulates, fragments, chunks, and regular molded parts, which are brittle to a greater or lesser degree and which can be reduced to particles by a grinding process. The important point here is that the particles or their precursors are formed under conditions of "oriented solidification", because this is what ultimately gives the end product obtained from the particles its superior properties. The processes known so far are limited to producing particles in limited batch quantities, but the solidification conditions do not yet meet the requirements for oriented solidification to a satisfactory extent.

A first practical area of application is the production of magnetic materials out of components selected from the lanthanides such as cobalt-samarium magnets, all of which are characterized by extremely high field strengths.

A second area of application is that of rechargeable batteries, for example, in which the electrodes consist of nickel-metal hydrides. This electrode material is preferably used in place of the highly toxic cadmium, preferably in the form of intermetallic, single-phase compounds of the rare-earth metals, abbreviated ABb, or multi-phase alloys of titanium and zirconium with certain percentages of nickel, cobalt, manganese, aluminum, vanadium, chromium, iron, or silicon. These multi-phase alloys are also referred to by the abbreviation $AB_2$.

A third area of application is, for example, the so-called hydride storage elements or hydrogen storage elements consisting of alloys such as lanthanum-nickel, titanium-iron, and magnesium-nickel, possibly with additional components from the group consisting of iron, titanium, zirconium, niobium, aluminum, manganese, lanthanum, and calcium.

A fourth area of application is that of getter alloys for other gases and catalysts.

Many production processes for the intermediate products in the form of particles for the indicated end products and their physical and metallurgical properties are state of the art, so that there is no need to describe them in detail here.

A great variety of centrifugal casting processes and equipment for the production of end products consisting of compact, solid, rotationally symmetric castings from a wide variety of different metals and alloys is also known. Until now, however, they have not been used to produce particles for the areas of application indicated above.

For example, it is known from JP 01-171 217 A1 that a centrifugal casting process can be used to produce a permanent tubular magnet out of a rare earth metals-iron-boron alloy with an outside diameter of 80 mm, an inside diameter of 40 mm, and a length of 200 mm. The casting weighs a few kilograms, and the only process provided for further processing is a heat treatment; a reduction to particles is not mentioned. In this known case, it depends very much on the process parameters during the centrifugal casting process whether solidification will occur with the desired orientation of whether it will occur from the inside out; in the case of oriented solidification, a grain structure which is referred to as "equiaxed" occurs at a point half-way through the thickness of the wall. The known process is neither intended nor suitable for the production of large amounts of powder-like particles of the indicated magnetic materials.

From DE 25 28 843 C2 it is known that high-strength, ring-shaped castings can be produced by atomizing a metal melt by means of a centrifuge driven at high speed and by centrifuging the atomized material onto a concentric, ring-shaped mold, which itself does not rotate. Upon impact, the metal droplets are deformed into pancakes and form a cohesive, possibly stratified structure, which, if necessary, can be further consolidated by secondary treatments. Oriented solidification cannot be carried out in this manner; and a reduction to particles is not only not recommended, it is expressly excluded.

Processes for the production of particles of brittle alloys, furthermore, are also known, where, in a first process step, plate-shaped or disk-shaped castings are produced by casting the alloy melts onto the center of flat cooling plates. These cooling plates can be located on the external surface of a polygonal drum or on a steel plate conveyor, or they can be stationary. In these cases, the melt simply spreads out horizontally in the radial direction under the action of gravity, i.e., at a relatively slow rate, so that the melt has already partially solidified before it reaches the edges of the cooling plate. In this case, solidification occurs in arbitrary directions.

It is also known that relatively small plates of brittle alloys can be produced between vertical, cooled walls; here solidification necessarily occurs from both sides, so that, in the middle, a crystalline structure again forms which is described as "equiaxed". It is also known that melts of brittle alloys can be poured onto slanted plates, so that the melt can spread under the action of gravity. In such a case, again, the disadvantages described above occur, namely, that solidification occurs prematurely and that the direction in which solidification occurs is uncontrollable.

In the process using flat cooling plates, the solidified and more-or-less brittle castings are converted by a grinding process into particles, which are intended as intermediate products for further processing into the desired end products, which is usually done by pressing and sintering or by the use of a plastic as a binder. In all cases, however, only small amounts of particles are obtained per working cycle, which means that the particles are extremely expensive to produce.

SUMMARY OF THE INVENTION

The object of the invention is to produce particles from the indicated alloys in large quantities at low cost and with a narrow particle size spectrum.

According to the invention, the melt is applied according to the principle of centrifugal casting onto the inside surface of an at least essentially cylindrical cooling surface rotating around a rotational axis at high speed, and the melt is cooled from the outside toward the inside with an essentially radial solidification orientation. The hollow casting thus obtained is reduced to particles.

Because of the nature of centrifugal casting, the melt spreads out extremely rapidly and reliably under the influence of centrifugal forces, which can be many times the force of the acceleration due to gravity, the melt reaching its final location before the solidification has proceeded to any significant extent. The casting also has an extremely dense, but monoaxial or radially oriented structure on its interior surface and is completely free of shrinkholes or other porous or fissured areas. When the alloys most frequently in question are used, the hollow body obtained is also extremely brittle and can be broken up into chunks or fragments by very weak external forces. These fragments can then be brought to the desired final state by a grinding process. The particles in question are within an extremely narrow grain size spectrum and are extremely fine because of the fast quenching rate. They are therefore highly suitable for the further processing required to obtain the final 3-dimensional shapes.

The melt is preferably applied to the rotating cooling surface in a thickness which is no more than 10%, and preferably no more than 5%, of the diameter of the cooling surface.

Tests have shown that the diameter of the cooling surface can be easily increased to 2,000 mm and its length of 4,000 mm or more, in which case the casting will have a final wall of thickness of somewhere between 20 and 50 mm. In this way, in the course of a single work cycle, a batch of several hundreds of kilograms can be obtained. As a result, a large number of end products with the required properties can be produced from a single batch. In the case of so-called hydride storage elements, the essential property is that the end product must have a relatively porous structure, through which hydrogen can flow with low flow resistance, so that the end products in question can absorb the hydrogen and also release it again extremely quickly.

According to a preferred embodiment, at least one melt stream is applied to the cooling surface first and then to a layer of the casting which has already at least partially cooled, during which the stream is subjected to axial displacement parallel to the axis of rotation AR—AR.

As a result of this measure, which is based on the idea of distributing the pouring process in a certain way over the course of time, the casting is formed by the gradual "winding" of the layers, so to speak, around the drum, and thus the growth direction of the crystals produced by the original layer is propagated into each successive layer of melt. This approach contrasts with the conventional centrifugal casting method, in which, if possible, all of the melt is introduced into the centrifugal casting mold in the shortest possible time.

The expression "in a nonreactive atmosphere" means that the process can be carried out either under vacuum or under a shield gas such as under nitrogen and/or argon. Vacuum prevents the oxidation of the melt and of the casting; shield gas also prevents the deposition of volatile components such as manganese, aluminum, chromium, magnesium, etc., from the vapor phase.

The invention also pertains to an apparatus for implementing the process described above. The cooling surface is part of a centrifugal drum, and the cooling surface is installed in a gas-tight chamber together with a device for producing at least one pouring stream.

It is also advantageous for the diameter of the cooling surface to be at least 200 mm, and preferably at least 500 mm.

The centrifugal drum is preferably open at one end and in the chamber. The chamber preferably has a door in the side where the open end of the centrifugal drum is, at which door a pouring device for the melt is provided.

The centrifugal drum with its cooling surface is preferably at least a part of a gas-tight chamber.

For the production of large quantities of powder particles in a single batch, the centrifugal drum can pivot around a horizontal tilting axis, which is perpendicular to the axis of rotation. The drum is provided with an opening, which winds up at the bottom when the drum is tilted and which can be closed by a sliding sealing wall, so that the solidified casting or its fragments can be emptied out from the bottom.

After the drum has stopped moving, the pieces of the casting can be encouraged to leave the centrifugal drum by gently knocking or shaking the drum. In the case of casting of higher strength, it is also possible to provide the walls or certain parts of the walls of the centrifugal drum with radially oriented, threaded holes, through which screws can be tightened against the casting, which breaks apart under the action of the screws to form chunks or fragments.

It is also advantageous for a pouring trough to be introduced into the centrifugal drum through the sealing wall; for a pull-back chamber for the casting trough to be installed in front of the outside surface of the sealing wall; and for the centrifugal drum to be connected in a gas-tight manner to the pull-back chamber by way of the sealing wall. The pull-back chamber is preferably equipped with a heating device, by means of which the pouring trough can be kept at the required operating temperature, so that the next process cycle can be begun quickly.

It is also advantageous for the partial length of the pouring trough which moves across the cooling surface to be provided with several outlets, so that several pouring streams are formed. As a result, very long cooling drums can be built, and yet the partial length in question of the cooling surface of the cooling drum will be supplied with melt almost simultaneously. This measure serves to increase in the production rate of the device even further.

BRIEF DESCRIPTION OF THE DRAWINGS

FIG. 6 shows an axial section through a fourth embodiment of a production system with an especially large production capacity.

DETAILED DESCRIPTION OF THE PREFERRED EMBODIMENT

Figure 1:
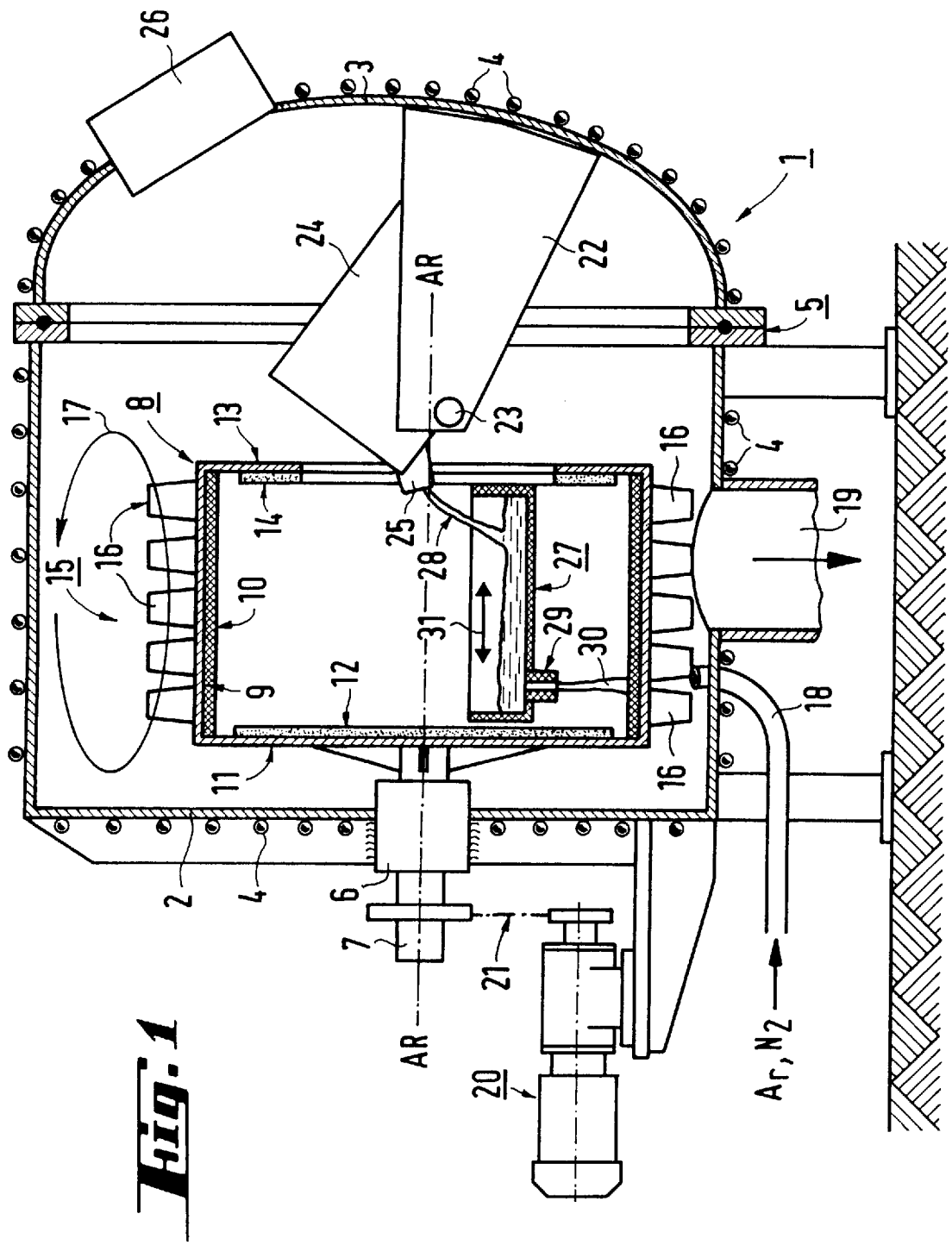
FIG. 1 shows an axial section through a first embodiment with means for cooling the cooling surface with gas.

FIG. 1 shows a gas-tight chamber 1 with a horizontal axis; a main chamber part 2; and a door 3, cooling pipes 4 being attached in a thermally conductive manner to the surfaces of the chamber and the door. Between main chamber part 2 and door 3 there is a flange connection 5. In a vertical wall of main chamber part 2 there is a gas-tight, rotary transmission leadthrough 6 for a shaft 7, to which a centrifuge drum 8 with a horizontal axis of rotation AR—AR is attached inside chamber 1. Centrifuge drum 8 has on its interior a cylindrical cooling surface 9, on which an already partially solidified casting 10 is shown, in the process of being formed. Centrifuge drum 8 also has a closed end wall 11, to which shaft 7 is attached and which is provided on its interior with a circular, disk-shaped insulating body 12 covering most of its surface. The opposite end of centrifuge drum 8 has a circular, ring-shaped end wall 13, which is covered on its interior with a circular, ring-shaped insulating body 14. Insulating bodies 12, 14 suppress the flow of thermal radiation from casting 10 toward the sides and interior as much as possible.

On the exterior of centrifuge drum 8 there is a device 15 for forced cooling, and in the case of FIG. 1 this device 15 consists of a total of 5 rings of impeller vanes 16, which simultaneously act as cooling ribs. Because the impeller vanes are positioned at an angle to the surface lines of centrifuge drum 8, the impeller vanes move the gas atmosphere in chamber 1 in the axial direction when centrifuge drum 8 is rotating. The cooling effect is obviously small when chamber 1 is operated under vacuum. After the chamber has been flooded with an inert gas, however, the cooling rate is increased significantly. In this case, a gas flow pattern develops which corresponds roughly to arrow 17. In other words, the gas atmosphere in chamber 1 is directed by impeller vanes 16 over the inside surfaces of cooled chamber 1, as a result of which an intensive heat exchange between cooling surface 9 and chamber 1 occurs. Chamber 1 is flooded with an inert gas such as argon or nitrogen through a gas line 18, which is connected to a gas source (not shown) with a shutoff valve. Via suction port 19, chamber 1 is connected to a set of vacuum pumps (not shown).

A gear motor 20, which is connected by way of a belt drive 21 to shaft 7, is used to drive centrifuge drum 8.

Two brackets 22 are attached to door 3, only the one further forward being visible, and between them there is a tilt axis 23 for an inductively heated melting crucible 24, which has a casting lip 25. The tilt drive and the feed lines for the melting current and the cooling water are not illustrated for the sake of simplicity; the casting process can be observed through a viewing window 26. Between cooling surface 9 and tilting crucible 24, a casting trough 27 is installed, into which, over casting lip 25, a first molten metal pouring stream 28 is conducted. The casting trough is provided with at least one outlet 29 to produce a second pouring stream 30, which serves to coat cooling surface 9. By means of a horizontal guide (not shown) and a drive, casting trough 27 can be moved in the direction of double arrow 31, preferably with an alternating motion, so that pouring stream 33 can be moved back and forth over at least most of cooling surface 9, as a result of which casting 10 acquires kind of "wound" structure, as explained in the general description above.

Figure 2:
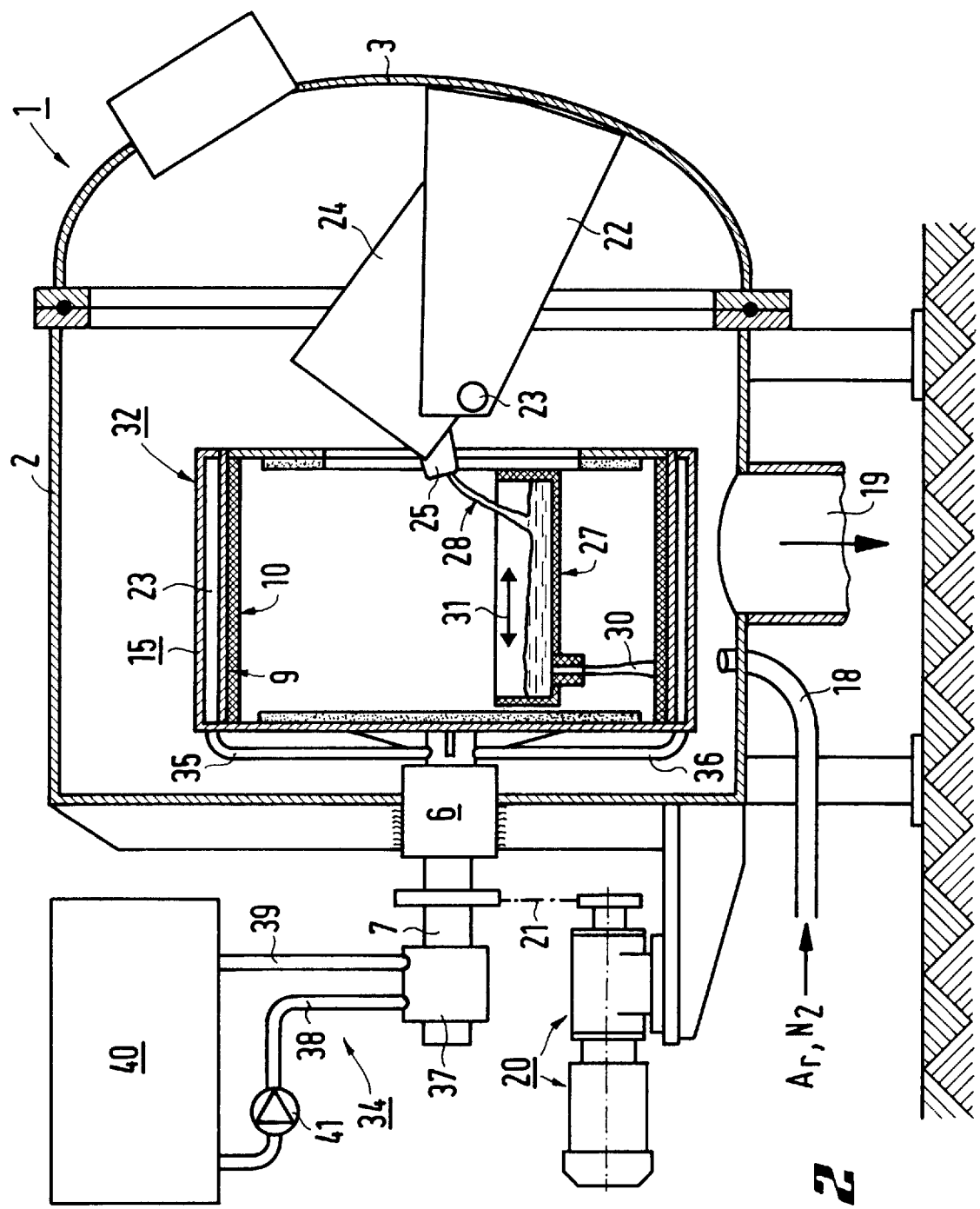
FIG. 2 shows an axial section similar to FIG. 1 through a second embodiment with means for cooling the cooling surface with liquid.

FIG. 2 differs essentially from FIG. 1 in that centrifuge drum 32 is provided on its outer periphery with an empty space 33, which has the same width as cooling surface 9 and which is connected to a coolant circuit 34. For this purpose, shaft 7 is provided with longitudinal channels (not shown), which are connected by way of radial lines 35, 36 to space 33. On the outboard side of belt drive 21, shaft 7 is provided with a rotary coupling 37, to which two lines 38, 39 lead, which are connected to a heat exchanger 40 for recooling a liquid coolant, preferably water. A pump 41 serves to circulate the coolant. In this way, the melt can be cooled quickly to produce casting 10.

On a much smaller scale than that of FIGS. 1 and 2, FIGS. 3–5 and FIG. 6 show two additional exemplary embodiments in which centrifuge drums 42, 43 and their cooling surfaces 9 themselves form the greatest part of gas-tight chambers 44, 45, so that there is no longer any need for an external, gas-tight chamber. This has the effect of reducing the investment and operating costs. Further, the length of time required to exchange the gas or to evacuate the complete system is drastically decreased.

Figure 3:
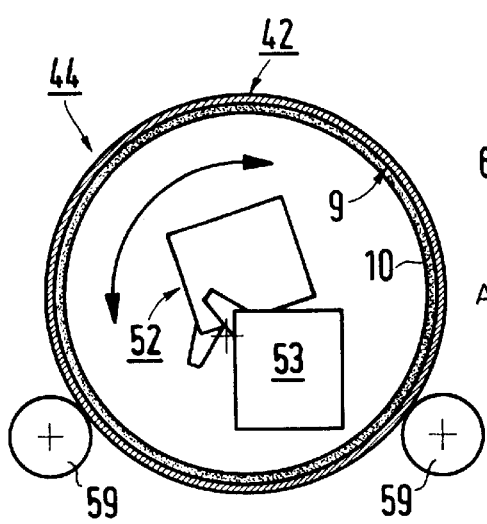
FIG. 3 is a radial section along lines III—III of FIG. 4.
Figure 4:
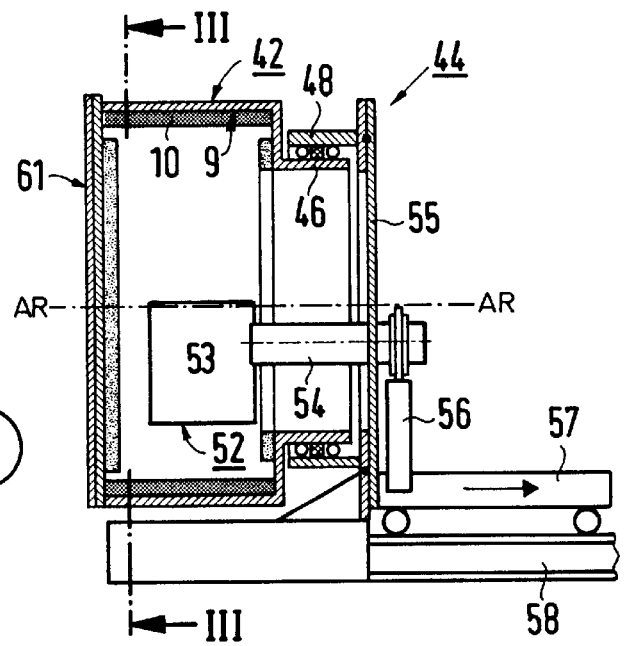
FIG. 4 is an axial section through a third embodiment in first operating position.
Figure 5:
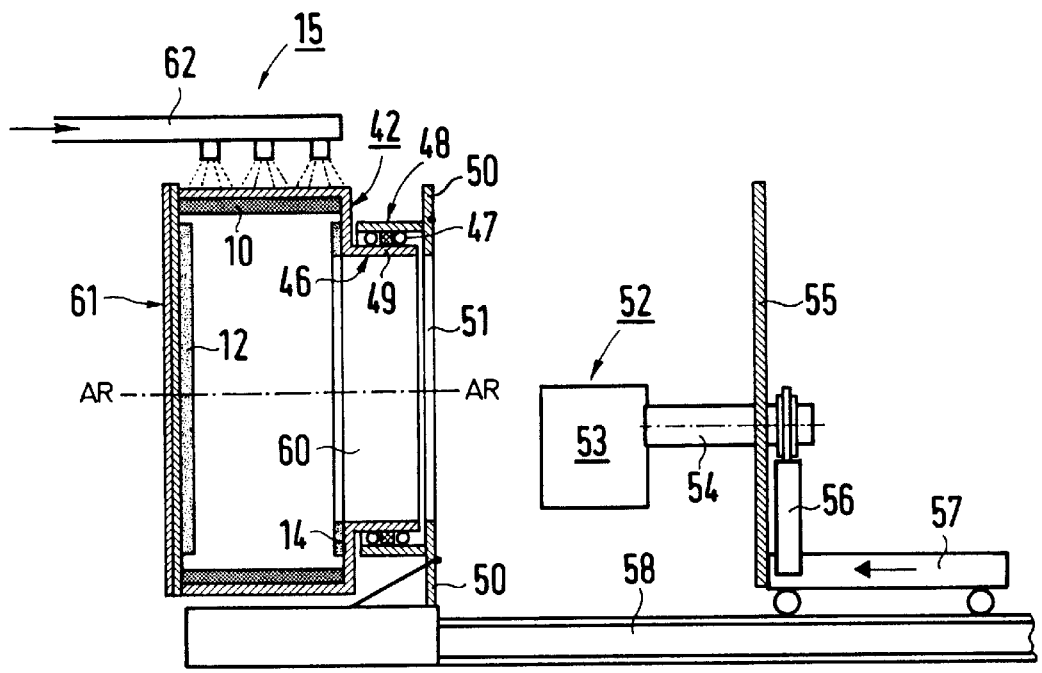
FIG. 5 is an axial section of a third embodiment in a second operating position.

In the exemplary embodiment according to FIGS. 3–5, centrifuge drum 42 is connected nonrotatably to a ring-shaped collar 46, which cooperates in a gas-tight manner by way of a radial bearing 47 with a stationary bearing ring 48. A ring seal 49 is shown crosshatched between the two sets of rolling elements which form the radial bearing. Stationary bearing ring 48 is attached to a chamber wall 50, which is provided with an opening 51 inside bearing ring 48; this opening allows a pouring device 52, which is designed as an inductively heated melting crucible 53 in this case as well, to be introduced into the chamber. Pouring device 52 is attached by means of a rotating extension arm 54 to a sealing plate 55, which serves to seal opening 51. To bring about the tilting motion, the two end positions of which are illustrated in FIG. 3, a tilting drive 56 is mounted together with sealing plate 55, in the manner shown on a truck 57, which can travel on rails 58 in the direction of the arrows (FIGS. 4 and 5).

Centrifuge drum 42 is supported in FIG. 3 on rollers 59, at least one of which is connected to a drive. In this way, centrifuge drum 42 can be rotated around axis of rotation AR—AR. FIG. 4 shows the system in the closed state. While the melt is being poured from melting crucible 53 in the counterclockwise direction as shown in FIG. 3, centrifuge drum 42 is rotating at high speed, so that the melt is immediately distributed over cooling surface 9, namely, both in the circumferential direction and also in a direction parallel to axis of rotation AR—AR. The process just described can be intensified by allowing melting crucible 53 to execute a reciprocating motion (not shown) parallel to axis of rotation AR—AR. By the continuous pouring of the melt, casting 10 is built up gradually from the outside toward the inside; the heat is conducted away radially toward the outside, and the crystallization process is induced to occur radially toward the inside. Here again, radiation losses toward the sides are suppressed as much as possible by insulating bodies 12 and 14 (FIG. 1). After melting crucible 53 is completely empty, it is tilted back into its starting position, and casting 10 is cooled until chamber 44 can be flooded without the danger of atmospheric oxygen harming the condition of the casting.

FIG. 5 shows the system according to FIG. 4 in the open state, in which melting crucible 53 can be loaded with a fresh batch of material to be melted. Casting 10 can be removed from centrifuge drum 42 in many different ways. In the case of especially brittle alloys, casting 10 can be easily broken, so that it can be removed through opening 60 in ring-shaped collar 46 and through opening 51 in chamber wall 50. In the case of materials which are not quite so brittle, end wall 61 of centrifuge drum 42 can be unscrewed, and casting 10, which has shrunk as a result of the cooling process, can be easily removed and then reduced to particles.

The cooling rate can be increased in the manner shown in FIG. 5, namely, in that a device 62 for spray-cooling is brought in to act on the outside surface of centrifuge drum 42. This device has been omitted from FIGS. 3 and 4 for the sake of simplicity. In this case, it is advisable to surround centrifuge drum 42 on all sides with a spray guard.

It should be mentioned at this point that the melt or casting 10 can be cooled in various ways. First, it is possible to provide the centrifuge drum with an appropriately sized mass of material with good thermal conductivity such as copper in the area of cooling surface 9. FIG. 1 shows a device 15 for forced cooling in the form of impeller vanes 16, which act as cooling ribs; the cooling action in this case is increased by the circulation of the gas and by the heat exchange with the cooled chamber wall. FIG. 2 shows the installation of a coolant-carrying space 33 around the circumference of cooling surface 9, and FIG. 5 shows the previously described spray cooling setup. Any of these cooling methods will cause the heat to be dissipated at least predominantly in one radial direction and to induce the grains to grow in the opposite radial direction, thus achieving the desired oriented solidification. The various cooling methods can obviously be carried over to the object of FIG. 6 also.

FIG. 6 shows a full-scale industrial system for the mass production of powdered particles of the type described. In this case, centrifuge drum 43 has an inside diameter of 2 m and a length of 4 m and is supported at both ends; that is, at one end, it is supported by a first radial bearing 63, which is mounted on a bearing block 64. The block can be shifted in the direction of the arrow. The other end of centrifuge drum 43 is supported on a sealing wall 65. Centrifuge drum 43 is driven in this case, too, by a gear motor 20 and a belt drive 21. The drive assembly can be disengaged from centrifuge drum 43 for reasons to be explained in greater detail below.

In the operating state shown in FIG. 6, in which casting 10 is being formed, a pouring trough 66 projects through sealing wall 65 into centrifuge drum 43. Pouring trough 66 is provided with several outlets 67 over the part of its length which is able to move over cooling surface 9. In the present case, there are six of these outlets 67, by means of which a total of 6 pouring streams are produced, as indicated by the arrows.

In front of, and a certain distance way from, the outside surface of sealing wall 65 there is a pull-back chamber 68 for pouring trough 66. A vacuum line 69 leads from pull-back chamber 68, only a short section of which is shown, to a set of vacuum pumps (not shown). In pull-back chamber 68, there is a heating device 70, by means of which pouring trough 66 can be pre-heated.

On one side of casting trough 66 and between centrifuge drum 53 and pull-back chamber 68 there is a melting and pouring device 71, which is designed as a vacuum induction furnace. A vacuum induction furnace of this type is described in detail in DE 35 30 471 A1, so that here only the most essential components and functions need to be described. A cover 72 is the central component of this melting and pouring device 71, and it is supported on two gas-tight pivot bearings 73 tangential to cover 72; these bearings have a large diameter so that they can encircle the outlets for pouring trough 66. A melting crucible 74 is suspended detachably from cover 72, and a loading device 75 for the material to be melted, only the lower part of which is shown, is located on cover 72; and between cover 72 and loading device 75 there is a vacuum valve 76. The entire melting and casting device 71 is able to pivot around an axis defined by pivot bearings 73, and during this pivoting motion, the melt passes through pouring opening 77 into pouring trough 66, when this trough is in the position shown in FIG. 6. The melt is distributed uniformly and continuously through the plurality of outlets 67 over cooling surface 9, both in the circumferential direction and also in a direction parallel to axis of rotation AR—AR. As soon as the pouring operation is completed, the cooling of casting 10 is completed by one of the measures described above. Then the connection between gear motor 20 and centrifuge drum 43 is disengaged, and the centrifuge drum is suspended from a cable winch 78 and pushed to the right by the displacement of bearing block 64 until sealing wall 65 is no longer in the associated opening of centrifuge drum 43. Before this is done, casting trough 66 is pulled back completely into pull-back chamber 68, where it is prepared for the next pouring operation.

Bearing block 64 carries a horizontal tilting axis AK, which is perpendicular to the axis of rotation AR—AR and to the plane of the drawing. This tilting axis AK also carries radial bearing 63. By means of cable winch 78, centrifuge drum 43 is now pivoted downward around tilting axis AK until the originally horizontal axis of rotation AR—AR arrives in position AR'—AR', which is essentially vertical.

Because the lower end of centrifuge drum 43 in this case is open, casting 10 falls down in the form of pieces into a transport cart 79 located underneath, which takes the material of casting 10 to a grinding device, not shown in here.

After it has been emptied, centrifuge drum 43 can be returned into the horizontal position by means of cable winch 78; and, by the displacement of bearing block 64 to the left, it can be brought back into contact with sealing wall 65, so that the device is ready to operate again as soon as pouring trough 66 has been moved in toward the right.

To avoid the transmission of vibrations, a bellows 80 is installed between sealing wall 65 and right pivot bearing 73. Bearing block 64 is located together with gear motor 20 and cable winch 78 on an intermediate platform 81. By way of gas-tight pivot bearing 73 and sealing wall 65, centrifuge drum 43 is also connected in a gas-tight and vacuum-tight manner to pull-back chamber 68. So that this chamber and melting and pouring device 71 can be kept under vacuum or shield gas, it is advisable to arrange a slide valve 82 between sealing wall 65 and the nearest pivot bearing 73.

In regard to the object of the invention, the particle production processes proceeds by way of one or more brittle, hollow bodies. In all cases, the ratio of (small) layer or wall thickness to (large) diameter promotes the solidification rate and thus enhances the radial orientation and fine granularity in association with a narrow grain size spectrum.

EXAMPLE

An apparatus according to FIG. 2 was evacuated to less than $10^{-1}$ mbar. The apparatus was equipped with a water-cooled centrifuge drum 8, which had a diameter of 600 mm and a length of 500 mm. The drum was run up to a speed of 475 rpm. The cooling water inlet temperature was 15° C., and the cooling water throughput was 65 L/min. Then, within a period of 45 seconds, 70 kg of Ni-mixed metal ($LaNi_5$) at a temperature above the liquidus temperature of the melt was poured in. After the melt had solidified, which took about 5 minutes, the speed was reduced to 140 rpm and kept at that speed for 15 minutes to allow the cooling process to continue. Then the chamber was flooded and opened: The hollow, crystalline casting, which had a wall thickness of 6–13 mm, had cracked in irregular fashion, but the pieces were of approximately the same size. Just before the drum came to a complete stop, some of these pieces fell down and formed a flat pile at the lowermost point of the drum. As a result of centrifugal force, however, even these fragments had been kept in contact with the cooling surface until shortly before the drum stopped, which meant that a very effective cooling action had been maintained as a result of the centrifugal force acting on the fragments. The pieces which had solidified in an oriented manner had an average size of 3 cm and could be easily removed and ground to a powder. $LaNi_5$ is a typical hydrogen reservoir alloy, which can be used as a substitute for NiCd in rechargeable batteries. Because of the very high power density and compact design of these batteries, they are highly suitable for a large variety of electronic devices such as laptop computers, mobile telephones, etc.

What is claimed is:

1. Process for the production of particles from castings, said process comprising providing a melt of metal selected from the group consisting of the lanthanides, aluminum, boron, chromium, iron, calcium, magnesium, manganese, nickel, niobium, cobalt, titanium, vanadium, zirconium, and alloys thereof, providing an inward facing at least substantially cylindrical cooling surface having a central axis of rotation and a diameter of at least 200 mm, rotating said cooling surface about said axis of rotation, applying said melt to said cooling surface during rotation in a nonreactive atmosphere so that a casting forms by the principle of centrifugal casting with cooling causing an essentially radial direction of solidification from the cooling surface toward the axis, and casting having a maximum radial-direction thickness no greater than 10% of said diameter, removing the solidified casting from said cooling surface, and grinding said casting to powder particles, and said metal of the melt being selected so that the casting therefrom is brittle enough to be crushed into powder and so that the powder from the casting is suitable for use as a magnetic material, a hydrogen accumulator, or a battery electrode.

2. Process according to claim 1, wherein at least one melt stream is first applied to the cooling surface under axial displacement parallel to the axis of rotation and then onto a layer of the casting which has already at least partially cooled.

3. Process according to claim 2, wherein the melt stream is reciprocated parallel to the axis of rotation.

4. The process according claim 1 wherein said maximum radial-direction thickness of said casting is no greater than 5% of said diameter.

5. The process according claim 1 wherein said diameter of said cooling surface is at least 500 mm.

6. The process according claim 1 wherein said melt is applied to said cooling surface from a crucible supported in a space interior to said cooling surface.

7. Apparatus for the production of castings to be ground into particles, said apparatus comprising a gas tight chamber, a centrifuge drum in said gas tight chamber, said drum having an inward facing substantially cylindrical cooling surface, said drum having a central axis of rotation, and said cylindrical surface having a diameter of at least 200 mm, means for rotating said drum about said axis of rotation, and pouring means for pouring a stream of metal melt against said cooling surface during rotation of said drum about said axis of rotation so that said melt solidifies into a casting with directional solidification proceeding substantially radially inward from said rotating cooling surface and such that said casting has a maximum radial-direction thickness of no more than 10% of the diameter of the cylindrical surface, said metal of the melt being selected so that the casting therefrom is brittle enough to be crushed into powder and so that the powder from the casting is suitable for use as a magnetic material, a hydrogen accumulator, or a battery electrode; and said chamber having means therein through which said casting can be withdrawn from said chamber either as a generally intact tube or in broken condition.

8. An apparatus according to claim 7, wherein the diameter of the cooling surface is at least 500 mm.

9. An apparatus according to claim 7, wherein said maximum radial-direction thickness of said casting is no greater than 5% of said diameter.

10. Apparatus according to claim 7, wherein the melt is applied to the cooling surface from a pouring trough present inside the cooling surface.

11. Apparatus according to claim 7, wherein the melt can be applied to the cooling surface from a melting crucible located inside the cooling surface.

12. Apparatus according to claim 7, wherein the centrifuge drum is open at one end and is located in the chamber, and the chamber has, at the open end of the centrifuge drum, a door, on which a casting device for the melt is provided.

13. Apparatus according to claim 12, wherein the pouring means comprises a tilting melting crucible.

14. Apparatus according to claim 13, wherein the pouring means further comprises a pouring trough between the melting crucible and the cooling surface.

15. Apparatus according to claim 14, wherein the pouring trough is installed so that it can move parallel to the axis of rotation.

16. Apparatus according to claim 7, wherein the cooling surface of the centrifuge drum forms at least part of the gas-tight chamber.

17. Apparatus according to claim 16, wherein the centrifuge drum is attached nonrotatably to a ring-shaped collar, which cooperates in a gas-tight manner by way of a radial bearing with a stationary bearing ring.

18. Apparatus according to claim 17, wherein the stationary bearing ring is attached to a chamber wall, which is provided with an opening inside the bearing ring for the introduction of a pouring device, which is a certain distance away from a sealing plate for said opening.

19. Apparatus according to claim 16, wherein the centrifuge drum can pivot around a horizontal tilting axis, which is perpendicular to the axis of rotation, and the centrifuge drum has an opening which arrives at the bottom after the drum has been tilted and which can be sealed by a sealing wall during the pouring operation, thereby making it possible to empty out the solidified casting from the bottom.

20. Apparatus according to claim 19, wherein said pouring means comprises a pouring trough which can be moved through the sealing wall into the centrifuge drum; said apparatus further comprising a pull-back chamber for the pouring trough in front of the outside surface of the sealing wall, and means for connecting the centrifuge drum in a gas-tight manner to the pull-back chamber by way of the sealing wall.

21. Apparatus according to claim 20, wherein the pouring trough is provided with several outlets for the formation of multiple pouring streams over the part of its length which can be moved over the cooling surface.

22. Apparatus according to claim 7, wherein means for forced cooling is provided on the outside surface of the centrifuge drum.

23. Apparatus according to claim 22, wherein said cooling means comprises at least one ring of impeller vanes on the outside surface of the centrifuge drum.

24. Apparatus according to claim 22, wherein said cooling means comprises means for spraying coolant against the outside surface of the centrifuge drum.

25. Apparatus according to claim 22, wherein said cooling means comprises a hollow space on the outside of the centrifuge drum, said hollow space being connected to a coolant circuit.

* * * * *

UNITED STATES PATENT AND TRADEMARK OFFICE
CERTIFICATE OF CORRECTION

PATENT NO. : 5,826,322
DATED : October 27, 1998
INVENTOR(S) : Hugo et al.

It is certified that error appears in the above-identified patent and that said Letters Patent is hereby corrected as shown below:

In column 9, line 25, change the word "and" to read as "said".

Signed and Sealed this

Twenty-eighth Day of November, 2000

*Attest:*

*Attesting Officer*

Q. TODD DICKINSON

*Director of Patents and Trademarks*